United States Patent [19]

Foust, Jr.

[11] 4,053,936
[45] Oct. 11, 1977

[54] READ AND WRITE CIRCUITRY

[75] Inventor: Tilman H. Foust, Jr., Gaithersburg, Md.

[73] Assignee: AMP Incorporated, Harrisburg, Pa.

[21] Appl. No.: 692,411

[22] Filed: June 3, 1976

[51] Int. Cl.² .......................... G11B 15/12; G11B 5/02
[52] U.S. Cl. ........................................... 360/62; 360/67
[58] Field of Search .................. 360/62, 67, 68, 51

[56] References Cited

U.S. PATENT DOCUMENTS 3,930,266  12/1975  Okamoto ............................. 360/62

Primary Examiner—Vincent P. Canney
Attorney, Agent, or Firm—Gerald K. Kita

[57] ABSTRACT

The present invention relates to circuitry providing both read and write capability for a two track card reader magnetic head which senses flux changes in either track. The write circuitry provides an interface between logic TTL format input and the current drive used to write with the magnetic head. The circuitry also provides control and level shifting network enabling the same magnetic head to be used for both reading and writing.

4 Claims, 8 Drawing Figures

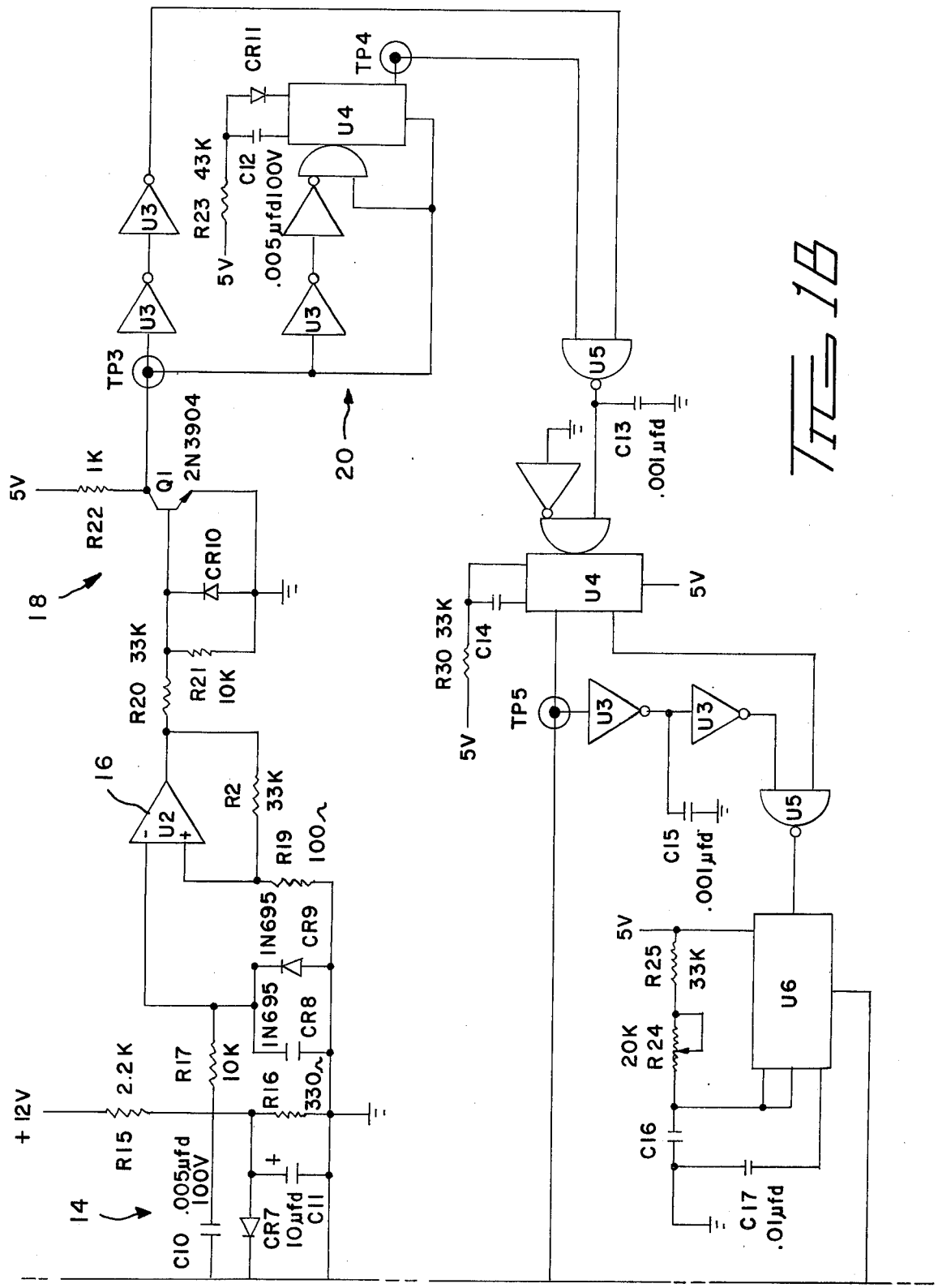

| DESIGNATION | I.C | +12V | -12V | +5V | GND. |
|---|---|---|---|---|---|
| U1 | MC1458 CPI | 8 | 4 | — | — |
| U2 | MC1458 CPI | 8 | 4 | — | — |
| U3 | MC 836P | — | — | 14 | 7 |
| U4 | SN 74123N | — | — | 16 | 8 |
| U5 | SN 7400 N | — | — | 14 | 7 |
| U6 | NE 555 V | — | — | 8 | 1 |
| U7 | SN 7410N | — | — | 14 | 7 |
| U8 | SN 7474 N | — | — | 14 | 7 |
| U9 | SN 7402 N | — | — | 14 | 7 |
| U10 | SN 7472 N | — | — | 14 | 7 |
| U11 | SN 7416 N | — | — | 14 | 7 |
| U12 | 899-1-R 2.2K | — | — | — | — |
| U13 | 898-3-R10K | — | — | — | — |
| U14 | MC 7805 CP | — | — | 2 | 3 |

READ AND WRITE CIRCUITRY

The present invention relates to circuitry providing both read and write capability for a two track card reader magnetic head which senses flux changes in either track. The read electronics is composed of an analog section and a F/2F to serial decoder. The analog section begins by amplifying the read head output data from a magnetically encoded card being read. The amplified signal is supplied to symmetrical and complimentary amplifiers which produce only positive outgoing signals regardless of the polarities in the flux reversals occurring at the read head. The signals are peak detected and made compatible with positive TTL logic. The digital section separates the clock pulses and the data pulses for transmission to a decoder whose bit cell timing reference is selectively altered by adjusting the RC constant of the timer.

The write electronics interfaces TTL logic input and the current drive used for writing with the magnetic read head channels. The electronics further provides a control and level shifting network so that the magnetic head is used for both reading and writing. Positive NOR gating is used in the write electronics to supply the current drive from positive 12 volts to ground or from ground to negative 12 volts through a pair of switching transistors, only one of which is conductive at any given time. The read circuitry, also connected to the magnetic read head, meanwhile is isolated from the 12 volt write signal by a high impedance supplied by clamping rectifiers of a differential amplifier which interfaces the read head with the read electronics. Similarly rectifiers interface the write circuitry with the read head and are high impedance at the operating voltages of the read electronics. Thus the high impedances respectively in the read and write circuits isolate one from the other.

OBJECTS

It is accordingly an object of the present invention to provide both read and write capability in the same magnetic head of a card reader device.

Another object of the present invention is to provide read head circuitry with high impedance to the output of a write circuitry and a high impedance in the write circuitry to the output of the read circuitry enabling both read and write capability in the same magnetic head.

Another object of the present invention is to provide a read circuitry with an analog section producing positive signals for the flux reversals on the card being read which signals are peak detected and made compatible with TTL logic for transmission to a decoder whose bit cell timing reference is determined by an adjustable clock.

Another object of the present invention is to provide a write circuitry for a magnetic head card reader wherein the polarity of the current drive used to write with the magnetic head is obtained by switching on either one but not both of a pair of transistors which are respectively referenced to positive and negative potential.

Other objects and many attendant advantages of the present invention will become apparent from the following detailed description taken in conjunction with the drawings.

DETAILED DESCRIPTION OF THE DRAWINGS

FIGS. 1a, 1b, and 1c are composite schematic diagrams of the read electronics according to the present invention.

DETAILED DESCRIPTION

Figures 1A, 1C:
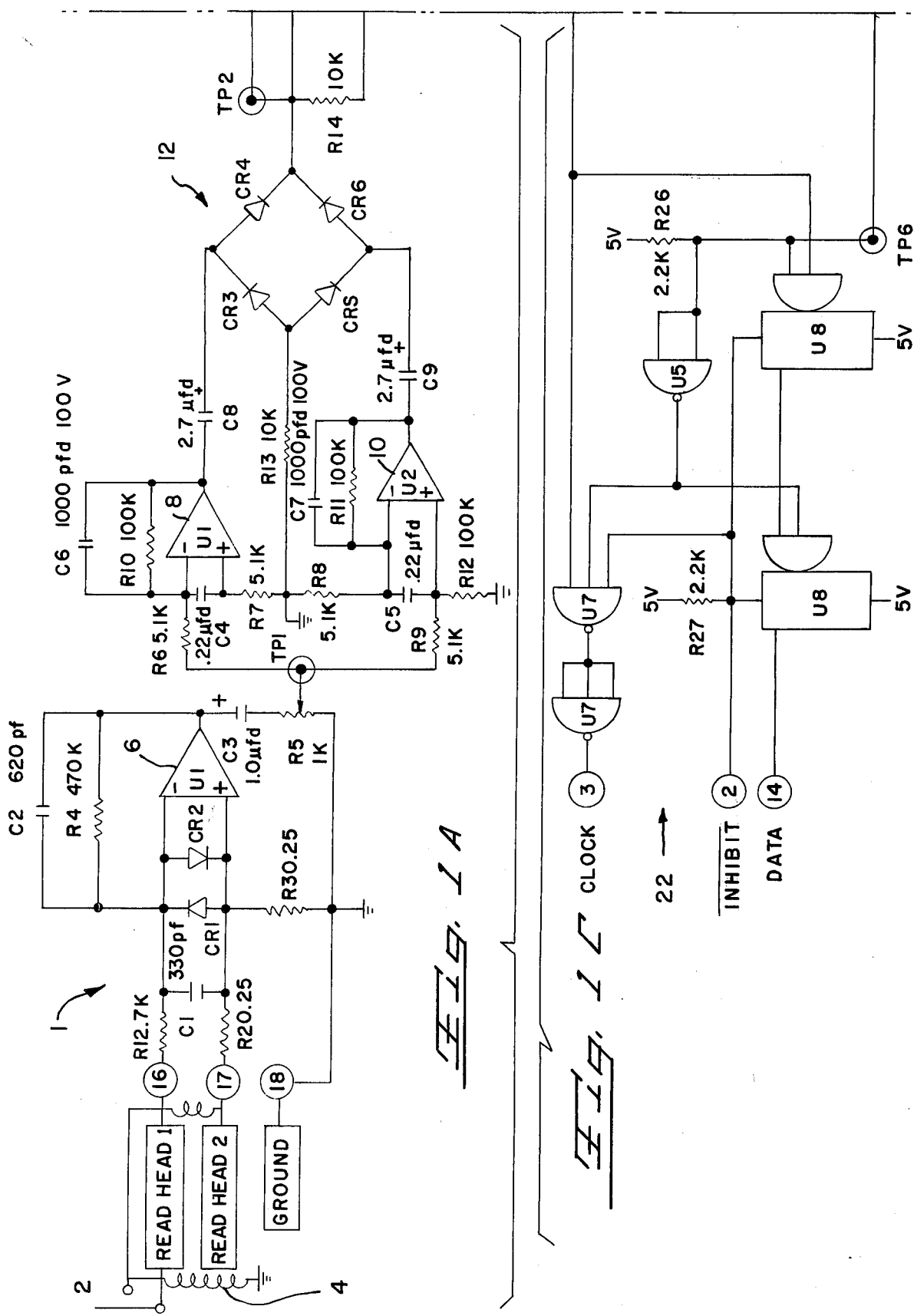

With more particular reference to FIGS. 1a–1c in the drawings there is shown generally all 1 a read circuit according to the present invention. The read head includes two tracks inductively coupled at terminals 16 and 17, which tracks are indicated in the drawings as read head 1 and read head 2. Read head 1 includes a terminal 2 inductively coupled to ground at 4. The analog section of the circuit begins by taking the inputs of the read head tracks to a first differential amplifier U1 generally shown in the drawings at 6. A parallel pair of rectifiers CR1 and CR2 are clamped in parallel across the inputs of the differential amplifier 6. The output from the differential amplifier is supplied to tie point 1, indicated at TP1 in the drawings, which output is indicative of the flux reversal at either track of a magnetic read head schematically indicated at 16 and 17.

In the description of the FIGURES the circuit components are illustrated with their corresponding impedance values. The designations U1 through U14 in the drawings refer to integrated circuits which are identified in the chart of FIG. 2.

Figure 4:
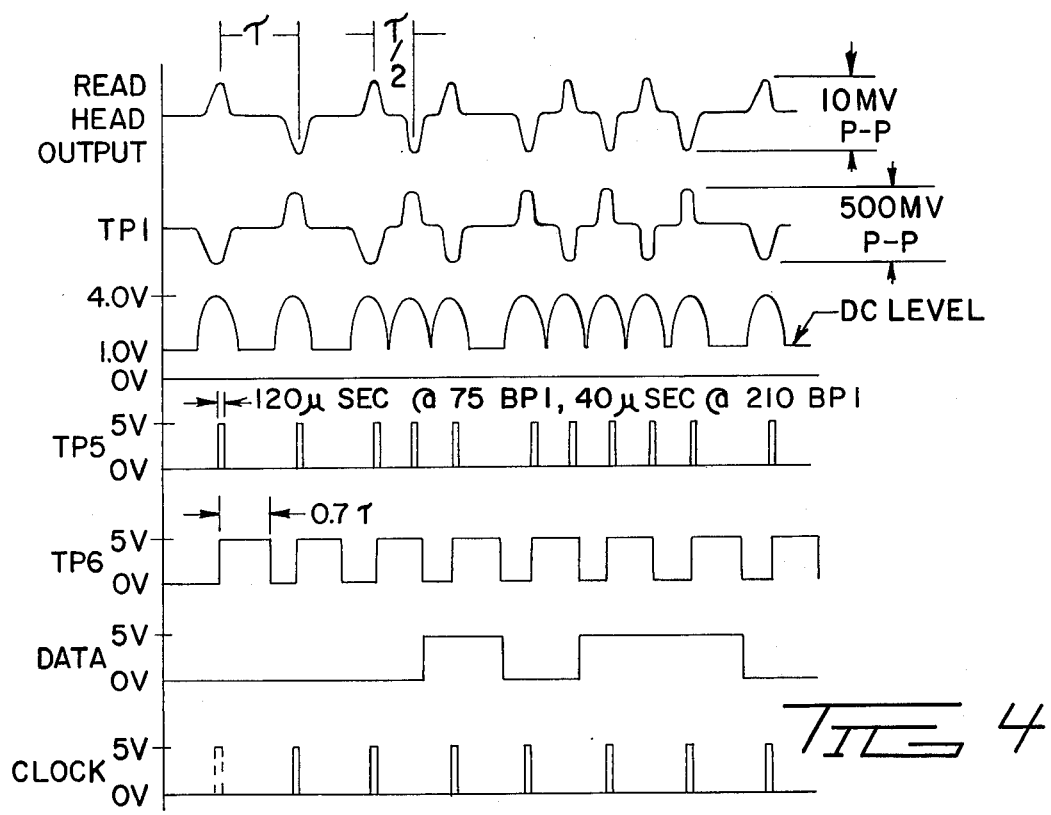
FIG. 4 is a timing diagram of the read circuitry according to the present invention.

Accordingly the analog section of the read electronics begins by amplifying the read head output. The amplified signal is then fed through a resistor R5 serving as the gain control to an amplifier section comprising symmetrical complimentary amplifiers 8 and 10 which cause positive going signals to appear at tie points 2 (TP2) regardless of the polarity of the flux reversal occurring at the read head. The outputs of the complimentary symmetrical amplifiers are supplied through a rectifier bridge 12 comprised of rectifiers CR3, CR4, CR5 and CR6 providing a DC threshold at TP2 to eliminate low level noise. Thus as shown in FIG. 4 the clock provides a series of 5 volt pulses occurring at a frequency determining the bit cell time Tau. The read head output provides flux reversals to be decoded, providing a zero if no flux reversal occurs during the bit cell time or providing a 1 if a flux reversal of 10 millivolts appears at Tau/2. The output of the differential amplifier 6 provides an amplified 500 millivolt signal at TP1. At TP2 the complimentary symmetrical amplifiers provide a 4 volt peak positive outgoing signal with a 1.0 volt DC threshold level impressed to eliminate noise. Between tie point 2 and tie point 3 (TP3), to achieve the most accurate input information, this series of 4 volt signals is supplied to a clipper 14 and to a differential amplifier 16 serving as a peak detector so that an output pulse occurs at TP3 at the maximum amplitude of the input signal. The output of the differential amplifier 16 is supplied through a Schmidt trigger 18 and then is made compatible for TTL logic by transistor Q1. Between TP3 and tie point 4 (TP4) is a pulse width discriminator 20 used to reduce sensitivity to noise.

The digital section 22 separates the clock pulses and the data pulses for transmission to the decoder. The bit cell timing reference for the decoder is adjusted by R24 which determines the RC time constant for the adjustable timer U6. The output is TTL positive logic. The clock is adjusted to 120 microseconds duration for 75 BPI and is adjusted for 40 microseconds for 210 BPI, bit per inch of card being read at the read head. An inhibiting input at terminal 2 is also provided which provides a selective terminal to prevent data from being transmitted from the data output 14 and the clock output 3 as desired. The digital section comprises at F/2F to serial binary converter. Thus as shown in FIG. 4 at TP5 5 volt pulses occur at the peaks of the incoming positive signals which are of adjustable duration. The signals occurring at tie point 6 are 5 volt peaks with a width of 0.7 Tau. The data transmitted to the decoder varies from 0 to 5 volts with little noise.

Figures 2, 3A:
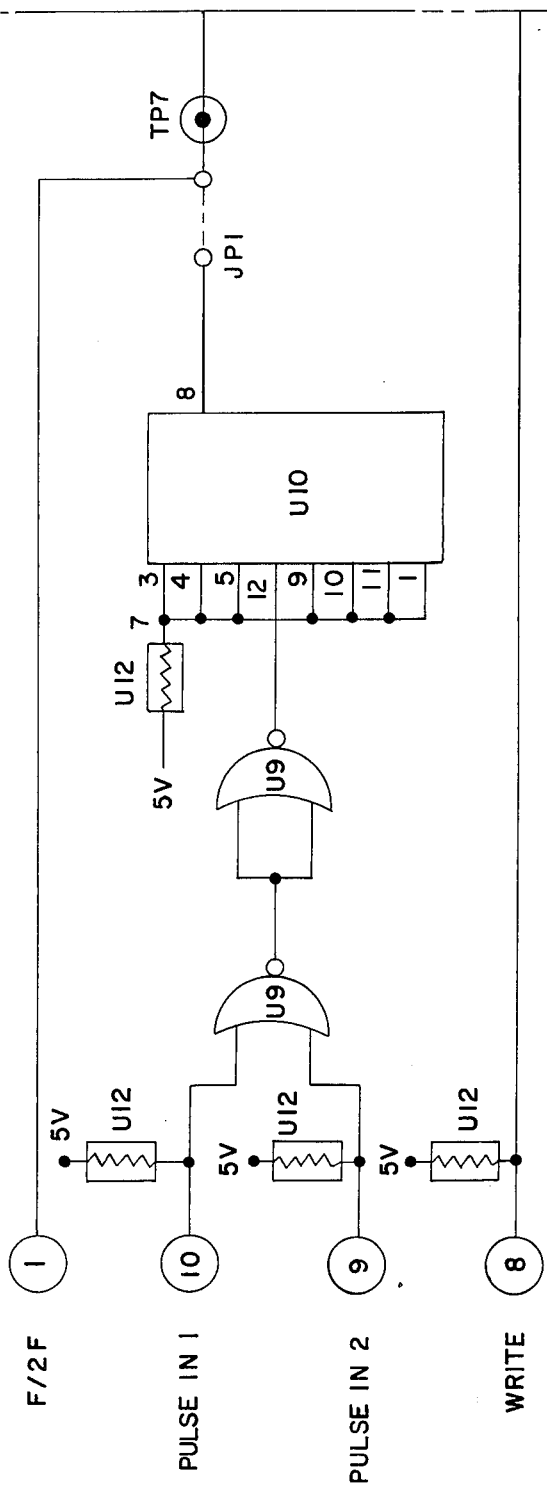
FIG. 2 is a chart of the integrated circuit components used in the present invention.
FIGS. 3a and 3b are composite schematic diagrams of the write circuitry according to the present invention.
Figure 3B:
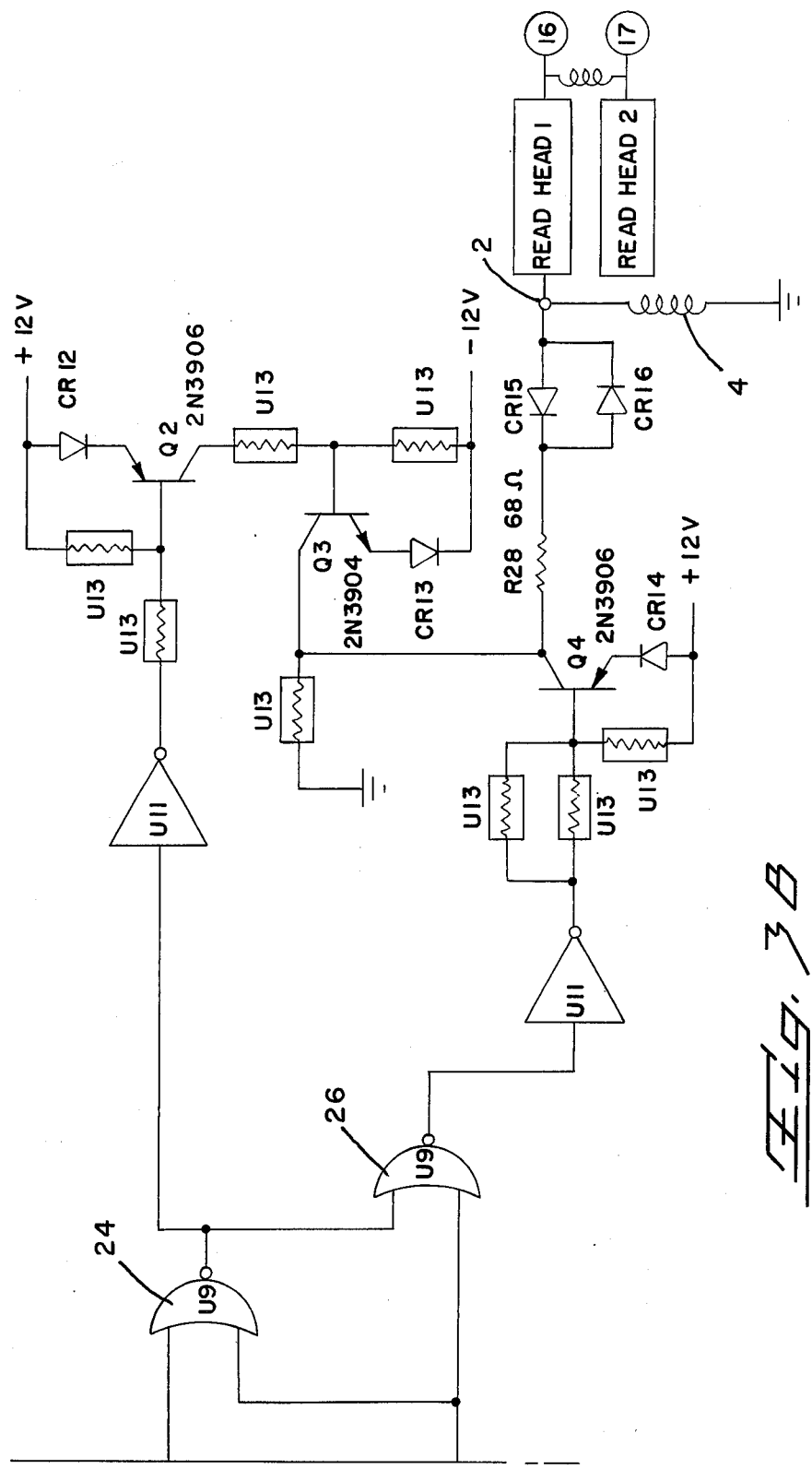
Figure 5:
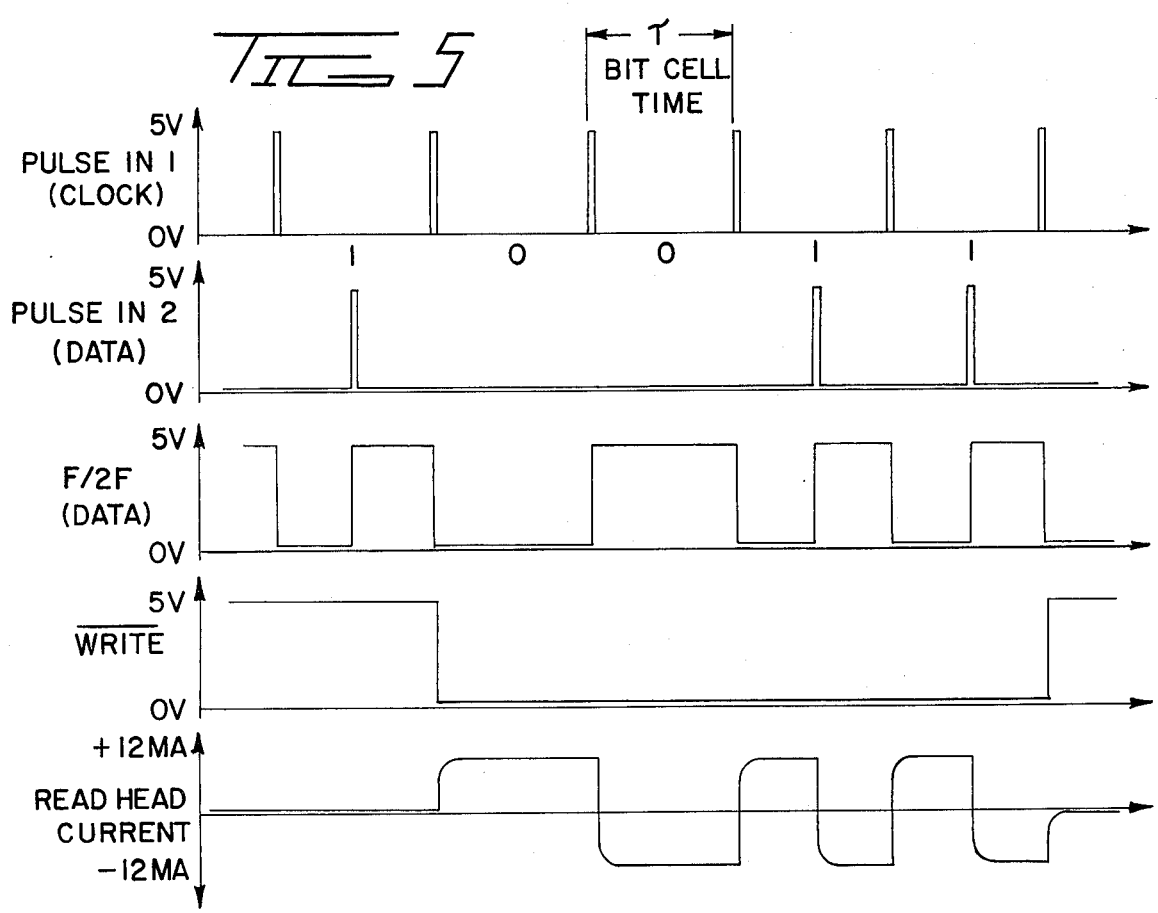
FIG. 5 is a timing diagram of the write circuitry according to the present invention.

With reference to FIGS. 3a and 3b the write circuitry will be described in detail. The circuitry has an enabling 5 volt positive write signal supplied to terminal 8 in the drawings whih in turn supplied an enabling signal to one side of each of a pair of positive NOR gates 24 and 26 located at the tie point 7 (TP7). Terminal 1 of FIG. 3a is provided to accept F/2F signals directly to TP7. Alternative input signals 9 and 10 are provided to accept pulses designated as pulse-in 1 and pulse-in 2. As shown in the timing diagram of FIG. 5 pulse-in 1 is a clock pulse while pulse-in 2 is the data being transmitted used to write with the magnetic tracks; i.e., read head 1 and read head 2. Thus at TP7 data may be supplied either directly by F/2F signal or clocked pulse data. If the latter is used a jumper point JP1 must be supplied to TP7. Also the pulses supplied to terminals 9 and 10 must be converted to F/2F signals through a flip flop U10. To enable U9, the write pulse must be zero or ground as shown in FIG. 5. Actually the first bit pulse is illustrated in the diagram as being lost because the write pulse is initially at plus 5 volts which disables the gates 24 and 26. When at ground, one side of each of the gates 24 and 26 is enabled. When a zero or ground is also supplied at TP7, both gates 24 and 26 give positive outputs. To get a zero output at least one positive is required on either input to the gates 24 and 26. More particularly when both the write signal and the signal supplied at TP7 are at zero gate 24 supplies a positive 5 volt pulse to the other gate 26 which supplies a zero output. The 5 volt output from the gate 24 is supplied to the output of the first gate U11 which produces a zero output changing the bias voltage on the base of transistor Q2 rendering it conductive. The bias voltage on the base transistor Q3 is thereby altered rendering Q3 conductive and causing current to flow from ground at U13 through Q3 to the minus 12 volt reference. Current thereby also flows from ground to minus 12 through the read head 1 from terminal 16 through CR15.

In another mode of operation, when the output of gate 24 is zero the zero signal is applied to enable the other gate 26 so as to supply a 5 volt output to the other gate U11 to supply a zero output which alters the bias voltage on the base of transistor Q4 rendering it conductive and allowing current flow from the positive 12 volt reference through Q4 and through CR16 to the read head 1 to ground at 4. Thus the current flows of plus 12 milliamps and minus 12 milliamps creates flux reversals which is used to write with the magnetic read head. During the writing mode the plus or minus 12 volt read head current is shunted to ground through either of the rectifiers CR1 and CR2 clamped across the inputs to the differential amplifier 6. A high impedance to the write signals is provided thereby isolating the read circuitry from the write signals. Similarly the threshold voltages of CR15 and CR16 serve as high impedance to the read output signals in the millivolt range thereby electrically isolating the write signals during operation of the read circuitry in the read mode.

Although a preferred embodiment of the present invention is disclosed in detail other embodiments and modifications thereto which would be obvious to one having ordinary skill in the art are intended to be covered by the spirit and scope of the appended claims.

What is claimed is:

1. A read circuit and a write circuit for a magnetic head wherein the circuits are isolated one from the other during operation of either one of said circuits, the combination comprising:

a read circuit provided with an input data line receiving read input signals, the output of said data line being supplied to an operational amplifier, a rectifier bridge and a peak detector in series producing an analog signal having peaks occurring at flux reversals of said read input signals, converter means for converting said analog signal to serial binary signals suitable for data reading, a timer input to said converter means for determining the bit cell time of said binary signals, the output of said converter means being suitable for data reading, a write circuit provided with a pair of positive NOR gates, the output of a first of said NOR gates connected to an input of a second of said NOR gates, a clock input line enabling one input of each of said NOR gates, a data input line enabling a second input of said first NOR gate, a first switch referenced to minus potential connected to said read head and causing current flow from ground to minus potential through the read head upon said first switch being enabled by the output of said first NOR gate, a second switch referenced at positive potential and connected to said read head and causing current flow from positive potential through said read head to ground upon enabling of said second switch by the output of said second NOR gate, and means electrically isolating said first and second switches from said read circuit and means electrically isolating said read circuit from current flow to said read head during operation of said write circuit.

2. The structure as recited in claim 1, wherein said first means includes a pair of parallel and mutually reverse-biased rectifiers connected between said read head and said first and second switches the threshold voltages of which rectifiers electrically isolating said write circuit from said read circuit.

3. The structure as recited in claim 1, wherein, said second means comprises a pair of parallel connected and oppositely biased rectifiers clamped across the inputs to said differential amplifier of said read circuit and shunting to ground current flowing through said read head and originating from said write circuit thereby electrically isolating the read circuit from said write circuit.

4. A write circuit for a read head comprising a pair of positive NOR gates, the output of a first of said pair of NOR gates being connected to a first input of a second one of said NOR gates,

- an input data line coupled to a first input of said first NOR gate,
- a clock input line coupled to a second input of each of said first and second NOR gates,
- a switch referenced to negative potential,
- a read head referenced to ground coupled to the output of said first switch,
- a second switch referenced to positive potential having an output coupled to said read head,
- an output of said first NOR gate enabling said first switch and causing current to flow from ground to said read head and through said switch to minus potential, and
- the output of said second NOR gate being coupled to and enabling said second switch causing current flow from positive potential through said second switch through said read head to ground, whereby positive potential current or negative potential current through said read head is produced by said write circuit.

* * * * *